(12) United States Patent
Nilsson et al.

(10) Patent No.: US 8,547,176 B2
(45) Date of Patent: Oct. 1, 2013

(54) DISTRIBUTED POWER AMPLIFIER WITH ACTIVE MATCHING

(75) Inventors: Joakim Nilsson, Mölndal (SE); Hans-Olof Vickes, Särö (SE)

(73) Assignee: SAAB AB, Linköping (SE)

( * ) Notice: Subject to any disclaimer, the term of this patent is extended or adjusted under 35 U.S.C. 154(b) by 27 days.

(21) Appl. No.: 13/377,719

(22) PCT Filed: Jun. 11, 2009

(86) PCT No.: PCT/SE2009/050720
§ 371 (c)(1),
(2), (4) Date: Dec. 12, 2011

(87) PCT Pub. No.: WO2010/144011
PCT Pub. Date: Dec. 16, 2010

(65) Prior Publication Data
US 2012/0086511 A1    Apr. 12, 2012

(51) Int. Cl.
*H03F 3/60* (2006.01)

(52) U.S. Cl.
USPC .................................. 330/286; 330/54

(58) Field of Classification Search
USPC ............... 330/286, 124 R, 295, 54
See application file for complete search history.

(56) References Cited

U.S. PATENT DOCUMENTS

| 6,342,815 | B1 | 1/2002 | Kobayashi | |
|---|---|---|---|---|
| 7,078,976 | B2* | 7/2006 | Blednov | 330/286 |
| 7,521,995 | B1* | 4/2009 | Krvavac | 330/124 R |
| 7,804,357 | B2* | 9/2010 | Shigematsu | 330/55 |
| 7,843,268 | B2* | 11/2010 | Benson | 330/286 |
| 2008/0030278 | A1 | 2/2008 | Shin et al. | |

FOREIGN PATENT DOCUMENTS

WO    WO-2009/139814 A2    11/2009

OTHER PUBLICATIONS

PCT/ISA/210—International Search Report—February 17, 2010.
PCT/ISA/237—Written Opinion of the International Searching Authority—February 17, 2010.
K. Narendra et al; "High Efficiency 600-m pHEMT Distributed Power Amplifier Employing Drain Impedance Tapering Technique"; 2008 IEEE; pp. 1769-1772.

* cited by examiner

*Primary Examiner* — Henry Choe
(74) *Attorney, Agent, or Firm* — Venable LLP; Eric J. Franklin

(57) ABSTRACT

A distributed power amplifier arranged to operate over a bandwidth. An input side with an input terminal is arranged to receive an input signal and connected to an input transmission line. An output side with an output terminal is adapted to deliver an output signal and connected to an output transmission line. A power splitter is connected to the input terminal, thus being arranged to divide the input signal in a first path to the input transmission line and in a second path to an input of an active matching circuit. The active matching circuit has an output connected to the output transmission line. The other end of the output transmission line is connected to the output terminal. A method to design a distributed power amplifier and to modify existing distributed power amplifiers.

13 Claims, 8 Drawing Sheets

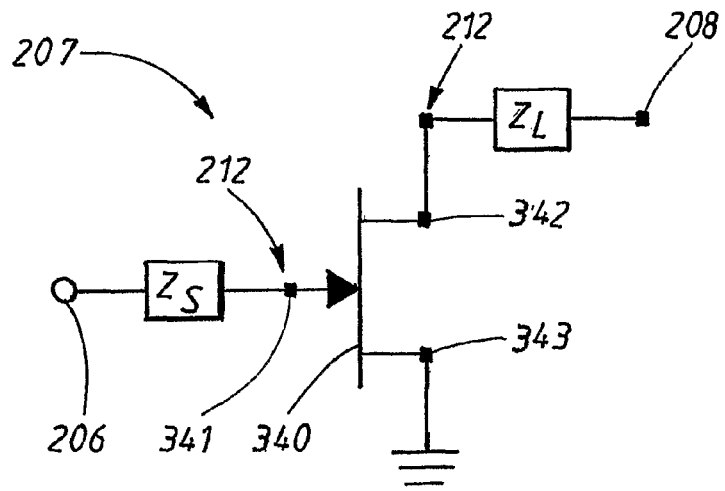
FIG.3
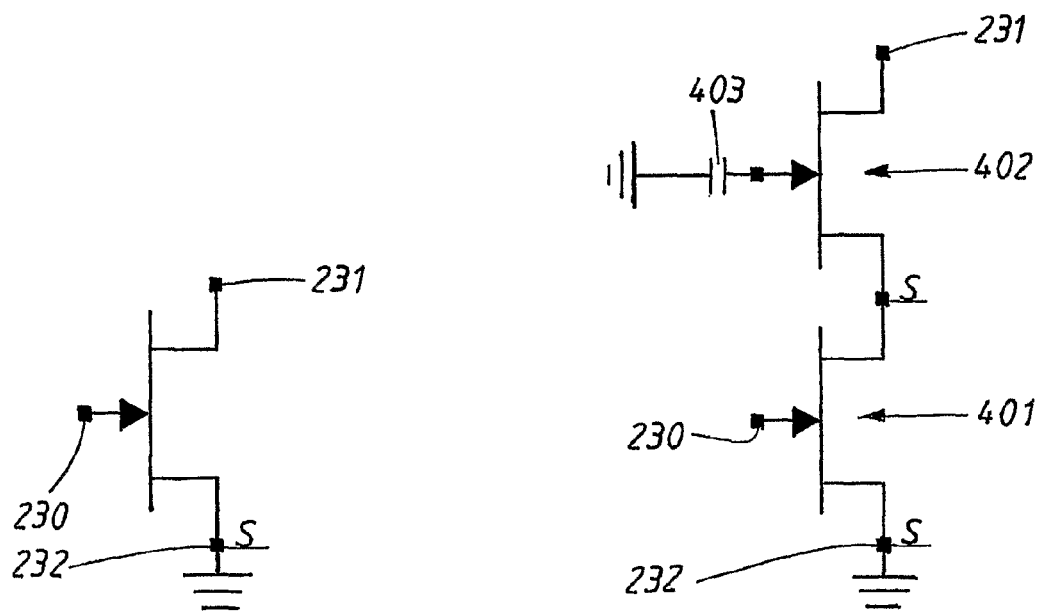
FIG.4a
FIG.4b

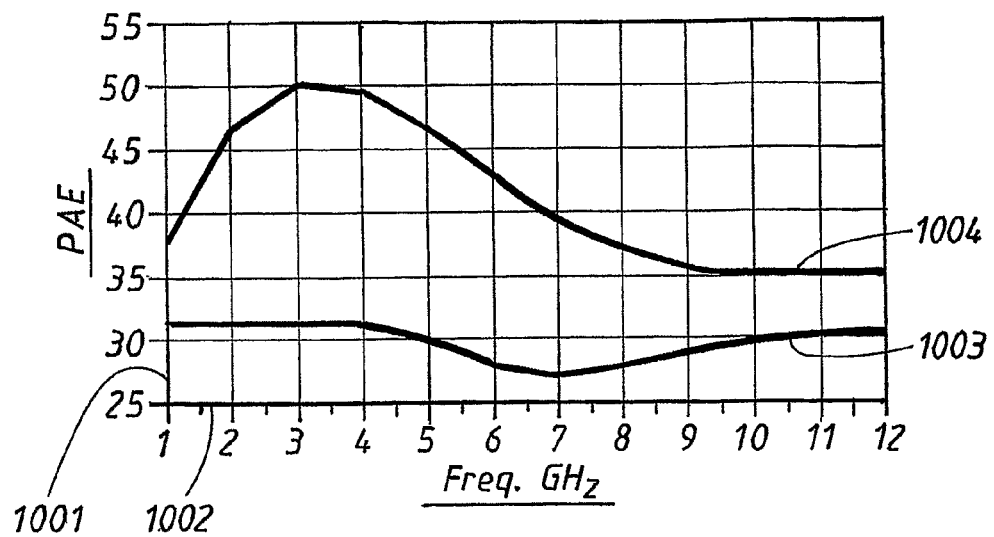
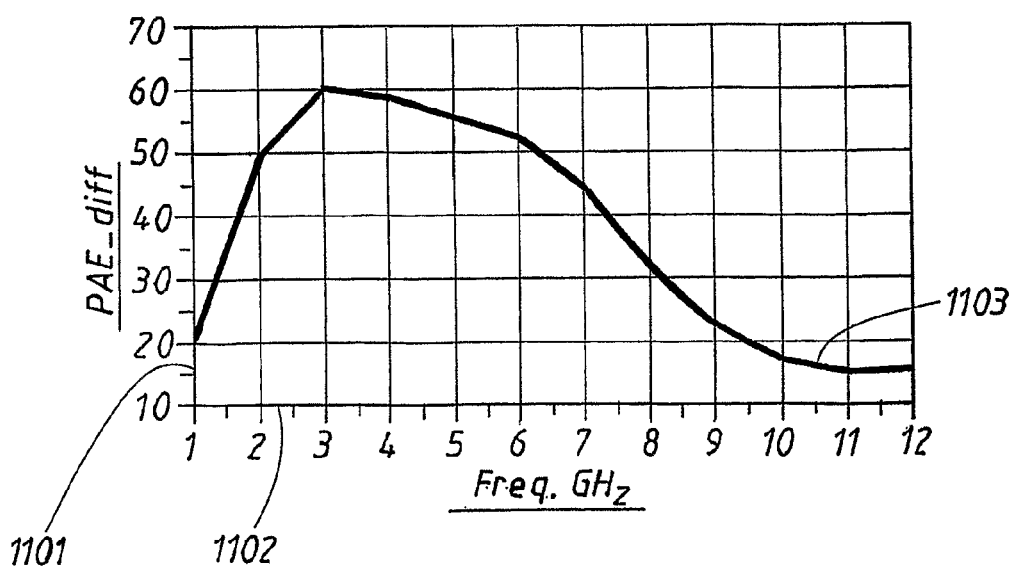
FIG. 11

DISTRIBUTED POWER AMPLIFIER WITH ACTIVE MATCHING

CROSS-REFERENCE TO RELATED APPLICATIONS

This application is the national phase under 35 U.S.C. §371 of PCT/SE2009/050720 filed 11 Jun. 2009.

TECHNICAL FIELD

The present invention relates to the field of broad band power amplifiers.

BACKGROUND ART

The concept of the distributed power amplifier dates back to the 1940s, when it was used in the design of broadband vacuum tube amplifiers. With recent advances in microwave integrated circuit and device processing technology, the distributed power amplifier has found new applications in broadband amplifiers. Bandwidths in excess of several octaves are possible, with good input and output matching properties as well as giving a flat gain over its bandwidth. There is however a problem to achieve a sufficient output power and Power Added Efficiency (PAE) over the bandwidth with the solutions available today. A prior art distributed power amplifier comprising 3 transistor cells is shown in FIG. 1.

FIG. 1 shows the principle of a prior art distributed power amplifier solution. The distributed power amplifier operates over a bandwidth B and has an input side 101 with an input terminal IN arranged to receive an input signal and an opposite output side 102 with an output terminal OUT arranged to deliver an output signal.

The input terminal IN located at the input side of the distributed power amplifier is connected to an input end 103 of a gate line 104. Suitable DC-biasing can be applied at a first DC-biasing point 105 located at the gate line and at a second DC-biasing point 106 located at a drain line 112. The gate line 104 comprises m transmission line sections $L_{gn}$ connected in series, where n is an integer ranging from 1 to m. The n integer is increasing in the direction towards the output side. In the example of FIG. 1, m=4. The gate line starts at the input end 103 with a first DC-blocking capacitor 109 and ends with a second DC-blocking capacitor 110 at an end opposite the input end 103, the opposite gate line end 108. At the opposite gate line end 108 a gate line end load 107 is connected to ground.

The output terminal OUT located at the output side 102 of the distributed power amplifier is connected to an output end 111 of the drain line 112. The drain line comprises m transmission line sections $L_{dn}$ connected in series, where n is an integer ranging from 1 to m and increasing in the direction towards the output end. The drain line ends at the output end 111 with a third DC-blocking capacitor 113 and starts with a fourth DC-blocking capacitor 114 at an end opposite the output end 111, the opposite drain line end 115. At the opposite drain line end 115, a first drain line end load 116 is connected to ground and at the output end 111, a second drain line load 117 is connected to ground.

Transistors $Tr_1$ to $Tr_{m-1}$, each with a source-118, a gate-119 and a drain terminal 120, are connected to the gate line and the drain line, with the gate terminal being connected the gate line and the drain terminal to the drain line, each source terminal being connected to ground. There is one transistor connection from a point between each pair of transmission line sections $L_{gp}/L_{gp+1}$ on the gate line to a point between each pair of transmission line sections $L_{dp}/L_{dp+1}$ on the drain line where p is an integer ranging from 1 to m−1. In the example of FIG. 1, m=4 which means that p assumes a maximum value of 3.

The transmission line sections $L_{gn}$ of the gate line are thus successively coupled to gate terminals of transistors $Tr_n$. The transistors can e.g. be of FET (Field Effect Transistor) type. The drain terminals of the transistors $Tr_n$ are also successively coupled to the drain line 112 comprising series coupled transmission line sections $L_{dn}$ as shown in FIG. 1. An RF (Radio Frequency) signal is fed at the input terminal IN and propagates through the gate transmission line 104, with portions of said signal being coupled to the transistors $Tr_n$. This solution has a relatively broad bandwidth by using the distributed/travelling wave principle, well known to the skilled person, where the input RF-signal is successively propagated to a second transmission line through the transistors.

A multioctave power amplifier with the solution as described in FIG. 1 typically has an average Power Added Efficiency (PAE) of 20% over the bandwidth.

In new radar systems and multifunctional systems comprising e.g. radar, communication and electronic warfare a broad bandwidth is used and thus a broad band PAE will be of increasing importance.

There is thus a need to achieve an improved PAE and output power for a distributed power amplifier over the entire bandwidth used by e.g. a radar- or multifunctional system. The bandwidth can be multioctave.

SUMMARY

The object of the invention is to reduce at least some of the mentioned deficiencies with the prior art solutions and to provide:

a distributed power amplifier and
a method to design a distributed power amplifier and to modify existing distributed power amplifiers to solve the problem to achieve an improved PAE and output power for a distributed power amplifier over the entire bandwidth used, where the bandwidth can be multioctave.

The object is achieved by providing a distributed power amplifier arranged to operate over a bandwidth B. The distributed power amplifier has an input side with an input terminal arranged to receive an input signal and connected to an input transmission line and an output side with an output terminal adapted to deliver an output signal and connected to an output transmission line. The input signal is arranged to be successively coupled from the input transmission line to the output transmission line through amplifiers connected between the input transmission line and the output transmission line. Both transmission lines have two ends wherein a power splitter is connected to the input terminal, thus being arranged to divide the input signal in a first path to the input transmission line and in a second path to an input of an active matching circuit. The active matching circuit has an output connected to the output transmission line, the other end of the output transmission line is connected to the output terminal, thus achieving an improved PAE performance and increased power output over the bandwidth B.

The object is further achieved by providing a method to design a distributed power amplifier operating over a bandwidth B. The distributed power amplifier has an input side, with an input terminal for receiving an input signal and connected to an input transmission line, and an output side with an output terminal for delivering an output signal and connected to an output transmission line. The input signal is successively coupled from the input transmission line to the output transmission line through amplifiers connected between the input transmission line and the output transmission line. Both transmission lines have two ends wherein a power splitter is connected to the input terminal, thus dividing the input signal in a first path to the input transmission line and in a second path to an input of an active matching circuit. The active matching circuit has an output connected to the output transmission line, the other end of the output transmission line is connected to the output terminal, thus achieving an improved PAE performance and increased power output over the bandwidth B.

The object is further achieved by a method to modify existing distributed power amplifiers operating over a bandwidth B. The distributed power amplifier has an input side with an input terminal, connected to an input transmission line for receiving an input signal and an output side with an output terminal connected to an output transmission line for delivering an output signal. The input signal is successively coupled from the input transmission line to the output transmission line through amplifiers connected between the input transmission line and the output transmission line. Both transmission lines have two ends wherein a power splitter is inserted between the input terminal and the input transmission line, thus dividing the input signal in a first path to the input transmission line and in a second path to an input of an inserted active matching circuit. The inserted active matching circuit has an output of the inserted active matching circuit connected to the output transmission line. The other end of the output transmission line is connected to the output terminal, thus achieving an improved PAE performance and increased power output over the bandwidth B for the existing distributed power amplifier.

A further advantage of the invention is the possibility to achieve a peak in the PAE value and output power within part of the bandwidth of the distributed power amplifier by using a special circuit implementation of the active matching circuit.

Additional advantages are achieved by implementing one or several of the features of the dependent claims not mentioned above. This will be further explained below.

BRIEF DESCRIPTION OF THE DRAWINGS

FIG. 3 shows a circuit diagram of an example of the active matching circuit.

FIG. 4a-4b shows examples of amplifier solutions.

FIG. 10 shows an example of differences in PAE, expressed in percentage, between different alternatives, peak and non-peak networks, of the active matching circuit.

FIG. 11 illustrates an example of the improvement in percentage of PAE value between a peak and non-peak network.

DETAILED DESCRIPTION

The invention will now be described with reference to the enclosed drawings.

As mentioned in the background, the distributed power amplifier has found new applications in broadband amplifiers. A problem is to maintain a high output power and PAE over its bandwidth. Therefore a proper selection of transistor types must be done. A typical maximum power density for a Gallium Arsenide transistor, (GaAs), transistor is approximately 1 W/mm gatewidth. With transistors using Wide Band Gap, (WBG), technology manufactured in Gallium Nitride, (GaN), the maximum power density can be increased to 7-8 W/mm gatewidth. These types of GaN transistors are therefore well suited for distributed power amplifiers. The invention can be implemented with any type of transistor types, but advantageously with high density type of transistors as e.g. the GaN transistors in WBG technology as described above.

Figure 1:
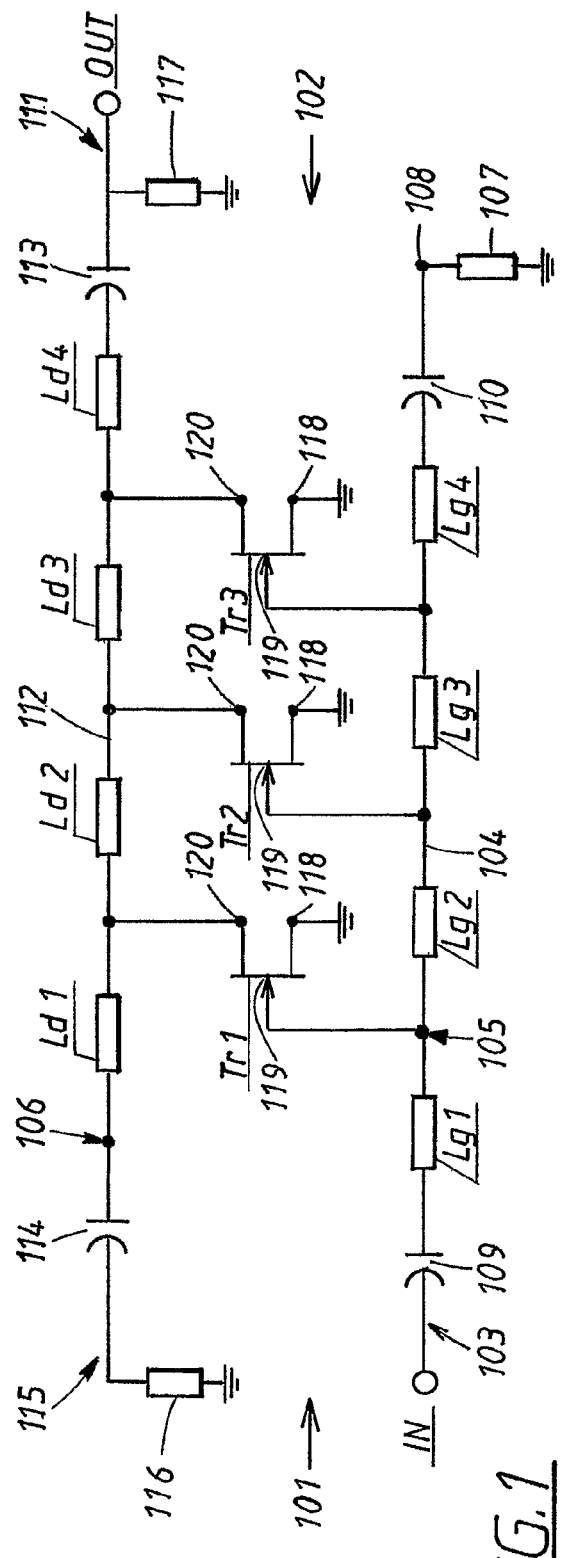
FIG. 1 shows a circuit diagram of a prior art distributed power amplifier.

The schematic representation of a distributed power amplifier in FIG. 1 is formed by periodically loading a pair of uniform or non-uniform transmission lines with FETs. A uniform transmission line is a line with the same impedance over its total length and a non-uniform line has an impedance variation along its total length, usually realized as a tapered variation or a step by step variation. Periodic loading can be accomplished e.g. with transistors (as in FIG. 1) or amplifiers (as will be shown in FIG. 2) that are successively coupled between the transmission lines. A transmission line is a distributed-parameter network, where voltages and currents can vary in magnitude and phase over its length. There are sometimes circuit reasons to replace transmission lines with inductors following the same principle i.e. periodically loading a pair of inductors with FETs. In the text below however, we use in all places, the wording transmission lines, which in this context can also encompass inductors as well.

Figure 2:
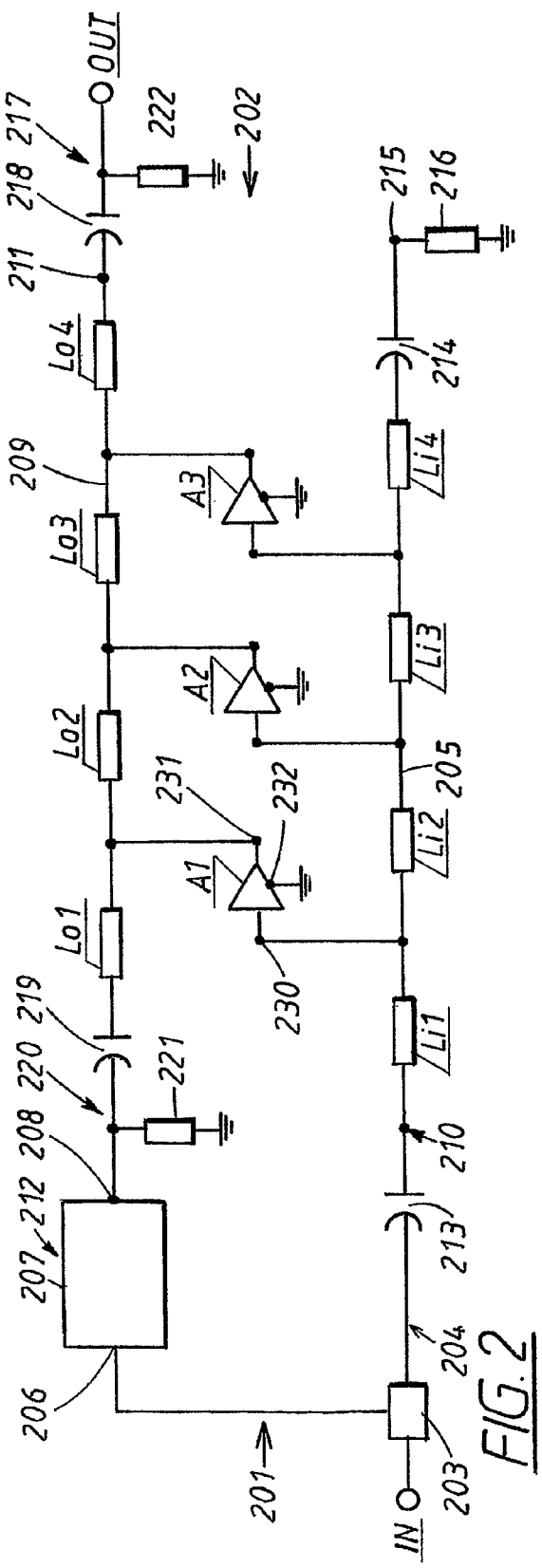
FIG. 2 shows an example of a circuit diagram of a distributed power amplifier with an active matching circuit according to the invention.

FIG. 2 shows one example of a distributed power amplifier according to the invention. The distributed power amplifier is arranged to operate over a bandwidth B and has an input side 201, with an input terminal IN arranged to receive an input signal, such as an RF-signal (Radio Frequency), and connected to an input transmission line 205. The distributed power amplifier further has an output side 202 with an output terminal OUT, adapted to deliver an output signal and connected to an output transmission line 209. The input signal being arranged to be successively coupled from the input transmission line to the output transmission line through amplifiers connected between the input transmission line and the output transmission line. Both transmission lines have two ends each.

A power splitter 203 is connected to the input terminal IN, thus being arranged to divide the input signal in a first path to the input transmission line 205 and in a second path to an input 206 of an active matching circuit 207. The active matching circuit has an output 208 connected to the output transmission line 209. The other end of the output transmission line is connected to the output terminal OUT, thus achieving an improved PAE performance and increased power output over the bandwidth B. The bandwidth B can be multioctave.

The output side 202 is normally opposite to the input side 201. One possible realization of the invention will now be described more in detail with reference to FIG. 2. The input terminal IN located at the input side 201 of the distributed power amplifier is as mentioned connected to a power splitter 203 dividing the input signal in a first path to an input end 204 of an input transmission line 205 and in a second path to the input 206 of the active matching circuit 207. The active matching circuit has the output 208 connected to an opposite end 220 of the output transmission line 209. Suitable DC-biasing can be applied at a third DC-biasing point 210 located at the input transmission line, a fourth DC-biasing point 211 located at the output transmission line 209 and a fifth DC-biasing point 212 located in the active matching circuit 207 as will be described. The input transmission line 205 comprises m transmission line sections $L_{in}$ connected in series, where n is an integer ranging from 1 to m. The n integer is increasing in the direction towards the output side. In the example of FIG. 2, m=4. The input transmission line starts at the input end 204 with a fifth DC-blocking capacitor 213 and ends with a sixth DC-blocking capacitor 214 at an end opposite the input end 204, the opposite input transmission line end 215. At the opposite input transmission line end 215, a load 216 is connected to ground.

The output terminal OUT located at the output side 202 of the distributed power amplifier is connected to an output end 217 of the output transmission line 209. The output transmission line comprises m transmission line sections $L_{on}$ connected in series, where n is an integer ranging from 1 to m and increasing in the direction towards the output side. The output transmission line ends at the output end 217 with a seventh DC-blocking capacitor 218 and starts with an eighth DC-blocking capacitor 219 at an end opposite the output end 217, the opposite output transmission line end 220. At the opposite output transmission line end 220, a first output load 221 is connected to ground and at the output end 217, a second output load 222 is connected to ground.

The load 216 and the first, 221, and the second, 222, output loads normally have an impedance value of around 50 ohms but can assume arbitrary impedance values.

Amplifiers $A_1$ to $A_{m-1}$, each with an input-230, an output-231 and a ground terminal 232, are connected to the input transmission line 205 and the output transmission line 209, with the input terminal being connected the input transmission line and the output terminal to the output transmission line, each ground terminal being connected to ground. There is one amplifier connection from a point between each pair of transmission line sections $L_{ip}/L_{ip+1}$ on the input transmission line to a point between each pair of transmission line sections $L_{op}/L_{op+1}$ on the output transmission line where p is an integer ranging from 1 to m−1. In the example of FIG. 2, m=4 which means that p assumes a maximum value of 3.

The detailed configuration of the distributed power amplifier as described above is in no way limiting; the first and last transmission line section of a transmission line can e.g. in some realizations just represent the impedance for connection to an input or output end, the number of amplifiers and line transmission sections can vary as well as the location of DC-biasing points and DC-blocking capacitors.

FIG. 3 shows an example of an active matching circuit 207 with a transistor 340, in this example a FET transistor, having a gate terminal 341, a drain terminal 342 and a source terminal 343. The second path of the input signal is connected to the input 206 of the active matching circuit 207. The input 206 is connected to the gate terminal 341 of the transistor 340 via an input load $Z_S$. The drain terminal 342 is connected to the output 208 of the active matching circuit via an output load $Z_L$. The output 208 is connected to the opposite output transmission line end 220. The source terminal 343 of the transistor 340 is connected to ground. Suitable DC-biasing are applied at DC-biasing points 212 located at the drain and gate terminal. The active matching networks, $Z_S$ and $Z_L$, according to FIG. 3 produce an increase in PAE and output power as well as small signal amplification over the bandwidth B. The level of the PAE value, output power and small signal amplification is however relatively constant over the bandwidth B. Hence this configuration of the active matching network is called a non-peak network. This will be illustrated in FIGS. 5b, 6b, 7 and 8. The invention is not limited to this realization of the non-peak network but it can also be realized with other suitable circuit solutions.

The amplifiers can be any suitable, conventional type. Two examples are shown in FIG. 4. FIG. 4a shows an example where the amplifier comprises a FET transistor where the input terminal 230 is connected to the gate of the transistor, the output terminal 231 to the drain of the transistor and the ground terminal 232 to the source of the transistor. FIG. 4b illustrates another example where the amplifier comprises two FET transistors, FET1, 401, and FET2, 402, coupled in a cascode configuration. A cascode configuration means that the source terminal of FET1 and the gate terminal of FET2 are connected to ground. The gate terminal of the FET2 can alternatively be AC coupled to ground via a capacitor 403. The drain terminal of FET1 is connected to the source terminal of FET2. The input terminal 230 of the amplifier is the gate terminal of FET1, the drain terminal of FET2 is the output terminal 231 of the amplifier and the source terminal of FET1 is the ground terminal 232. For clarity reasons, DC biasing is excluded in the examples of FIG. 4. The invention is not limited to these examples of amplifiers, but other amplifiers with other types of components as e.g. other transistor types with different configurations can also be used.

Figure 5A:
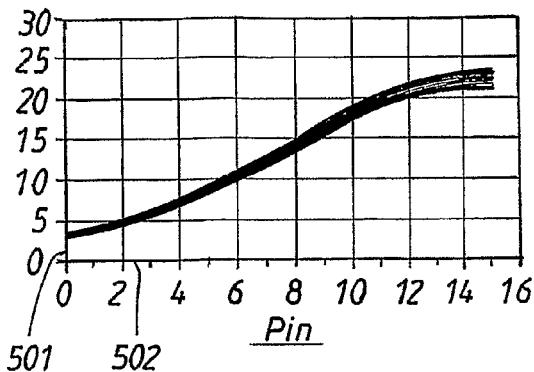
FIG. 5a-5b shows Power Added Efficiency (PAE) in percentage for an example of a distributed power amplifier according to the invention as a function of input power in dBm and frequency as parameter, with (5b) and without (5a) the active matching circuit implemented.
Figure 5B:
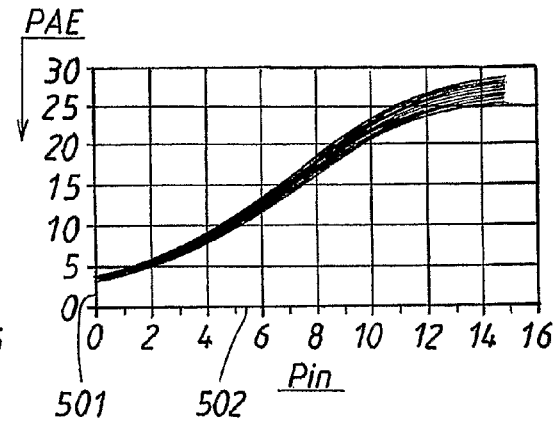

FIG. 5 shows simulation results from an example of the invention with a non-peak network. This is illustrated with graphs of the PAE in percentage on the y-axis 501 as a function of input power $P_{in}$ on the x-axis 502 without the active matching circuit implemented, FIG. 5a, and with the active matching circuit implemented, FIG. 5b. The input power is shown in dBm. The PAE-percentage is calculated as $P_{out}-P_{in}$ divided with the total dc-power supplied to the complete distributed power amplifier. $P_{in}$ and $P_{out}$ is the RF (Radio Frequency) power. The simulation is made in the frequency interval 1-10 GHz in one GHz steps. When FIGS. 5a and 5b are compared it can be seen that the PAE value is improved with the active matching circuit implemented. At an input power of 12 dBm the PAE value is around 20% without the active matching circuit implemented and about 25% with the active matching circuit implemented.

Figure 6A:
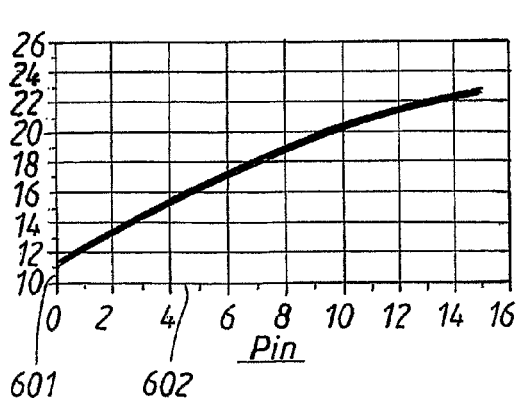
FIG. 6a-6b shows output power in dBm for an example of a distributed power amplifier according to the invention as a function of input power in dBm with frequency as parameter, with (6b) and without (6a) the active matching circuit implemented.
Figure 6B:
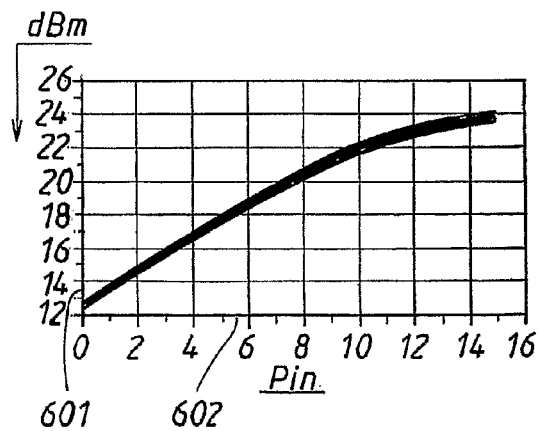

FIG. 6 shows simulation results from an example of the invention with a non-peak network. This is illustrated with graphs of the simulated output power in dBm on the y-axis 601 as a function of input power $P_{in}$ on the x-axis 602 without the active matching circuit implemented, FIG. 6a, and with the active matching circuit implemented, FIG. 6b. The input power is shown in dBm. The simulation is made in the frequency interval 1-10 GHz in one GHz steps. When FIGS. 6a and 6b are compared it can be seen that the output power is improved with the active matching circuit implemented. At an input power of 12 dBm the output power is around 21 dBm without the active matching circuit implemented and about 23 dBm with the active matching circuit implemented.

Figure 7:
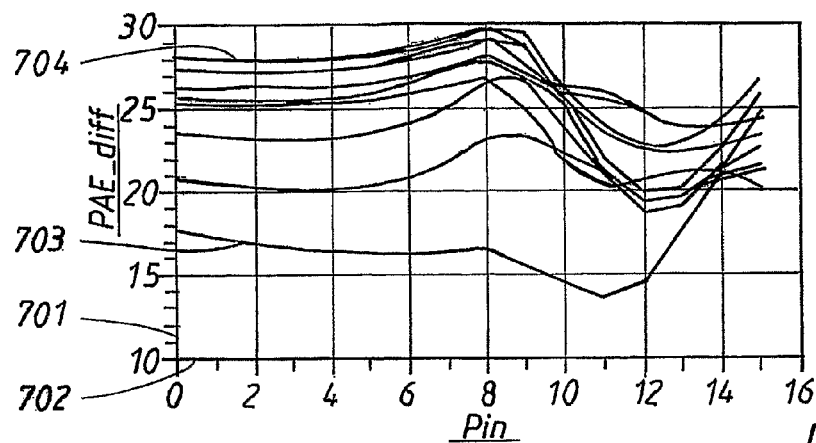
FIG. 7 shows improvements in percentage of PAE as a function of input power in dBm with frequency as parameter, with an example of the active matching circuit implemented.

FIG. 7 shows simulation results from an example of the invention with a non-peak network. This is illustrated with graphs of the increase in PAE in percentage on the y-axis 701 as a function of Pin on the x-axis 702 measured in the frequency interval 1-10 GHz in one GHz steps when the active matching circuit is implemented. Graph 703 is measured at 10 GHz and graph 704 for 1 GHz. As a rough average, it can be seen that the active matching circuit achieves an improvement of the PAE of 20% in the frequency interval 1-10 GHz.

Figure 8:
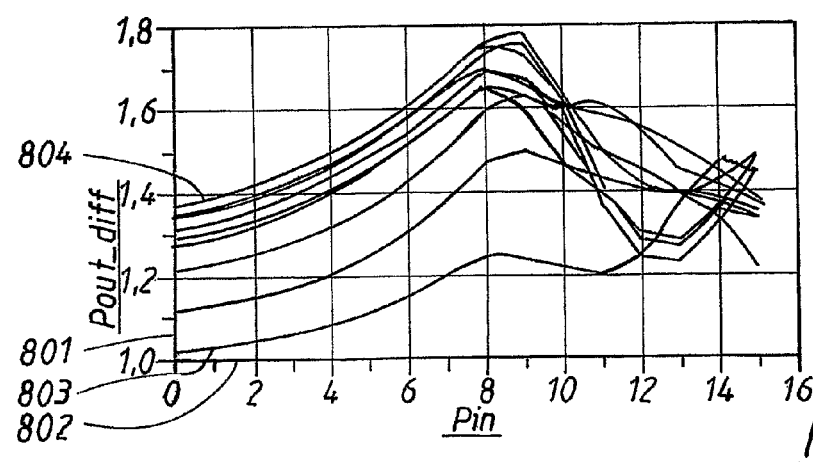
FIG. 8 shows improvements in dB of output power as a function of input power in dBm, with frequency as parameter, with an example of the active matching circuit implemented.

FIG. 8 shows simulation results from an example of the invention with a non-peak network. This is illustrated with graphs of the increase in output power in dB on the y-axis 801 as a function of Pin on the x-axis 802 with frequency as a parameter and variation over 1-10 GHz in one GHz steps when the active matching circuit is implemented. Graph 803 illustrates performance at 10 GHz and graph 804 for 1 GHz. As a rough average, it can be seen that the active matching circuit achieves an improvement of the output power of about 1.2 dB in the frequency interval 1-10 GHz.

Figure 9A:
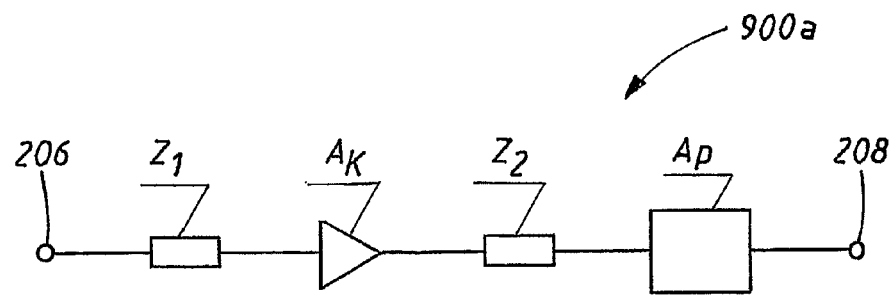
FIG. 9a shows an alternative example of the active matching circuit allowing the location of an output peak.

FIG. 9a shows a block diagram of an example of an alternative active matching circuit 900a, called a peak network, allowing the location of an output peak, of the PAE value and the output power value within the frequency band B. This active matching circuit comprises an amplifier arrangement, Ak, having an input end and an output end, with a first matching impedance $Z_1$, having two ends, with the first end connected to the input end of the Ak and a second matching impedance $Z_2$, having two ends, with the first end connected to the output end of the Ak. The second end of the first matching impedance $Z_1$ is connected to the input 206 of the active matching circuit 900a. Examples of Ak realizations are shown in FIGS. (4a) and (4b). The second end of the second matching impedance $Z_2$ is connected to a first end of a circuit arrangement, Ap, having two ends. The second end of the Ap circuit is connected to the output 208 of the active matching circuit 900a. This configuration of the active matching circuit makes it possible to get an output peak of the PAE value and the output power. The Ap arrangement can be realized in several ways. One example of such a realization is described in detail in FIG. 9b below.

The active matching circuit 900a of FIG. 9a can be summarized as comprising a first matching impedance $Z_1$, an amplifier arrangement Ak, a second matching impedance $Z_2$ and a circuit arrangement Ap connected in series in the order mentioned, each component having two ends, the first matching impedance being further connected at a free end to the input 206 of the active matching circuit and the circuit arrangement Ap being further connected at a free end to the output 208 of the active matching circuit.

Figure 9B:
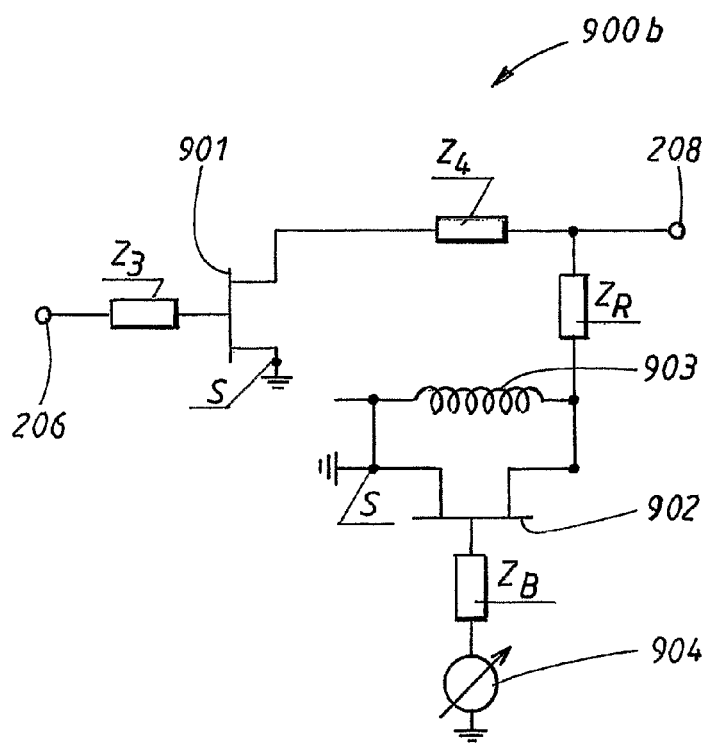
FIG. 9b shows a further example of the active matching circuit allowing the location of an output peak.

FIG. 9b shows a circuit diagram of a further alternative example for an active matching circuit 900b comprising a first, 901, and a second, 902, matching transistor allowing the location of an output peak, of the PAE value and the output power value, within the frequency band having the bandwidth B. This example of an active matching circuit has the input 206 of the active matching circuit connected to the gate terminal of the first matching transistor, 901, via a third matching impedance $Z_3$. The source terminal of the first matching transistor 901 is connected to ground and the drain terminal is connected to the output 208 of the active matching circuit via a fourth matching impedance $Z_4$. The output 208 is connected to the opposite end 220 of the output transmission line 209. Compared to the active matching circuit of FIG. 3, the second matching transistor, 902, has been added. The source terminal of the second matching transistor, 902, is connected to ground and the drain terminal of the second matching transistor 902 is connected to the output 208 of the active matching circuit via an impedance $Z_R$, which normally is mainly resistive. An inductor 903 is applied between the source and the drain terminal of the second matching transistor 902. The gate terminal of the second matching transistor 902 is connected to ground via a DC biasing impedance $Z_B$ in series with a control voltage source 904. Other DC biasing components are not shown for clarity reasons.

The second matching transistor 902 can be arranged to be turned on and off by means of changing the voltage of the control voltage source 904. When the second matching transistor 902 is arranged to be turned on the output 208 of the active matching circuit will be shorted to ground through the impedance $Z_R$. This means that the configuration of this alternative active matching circuit will be similar to the configuration of the active matching circuit of FIG. 3, a non-peak network, with the difference that the impedance $Z_R$ will be in parallel with the first output load 221. Thus, the characteristics of a non-peak network is created. This configuration with the second matching transistor 902 in "on mode" will then result in similar PAE and power output characteristics as explained and shown in FIGS. 5 to 8, i.e. for a non-peak network.

When the second matching transistor 902 is arranged to be turned off, the output 208 of the active matching circuit will be connected to ground via the impedance $Z_R$ and the inductor 903, thus creating the characteristics of a peak network. By varying the inductance values of the inductor it is possible to optimize the PAE and output power at certain frequencies within the bandwidth B. This will result in a peak of the PAE and output power as will be shown in FIGS. 10 -13 and explained below. A typical inductor value can be in the region 1 to 10 nH. However, also other values are possible within the scope of the invention.

Each matching network mentioned in association with FIGS. 3, 9a and 9b may comprise an inductor, a capacitor or combinations of these and/or other components, the combinations comprising parallel and/or serial connections.

Figure 13:
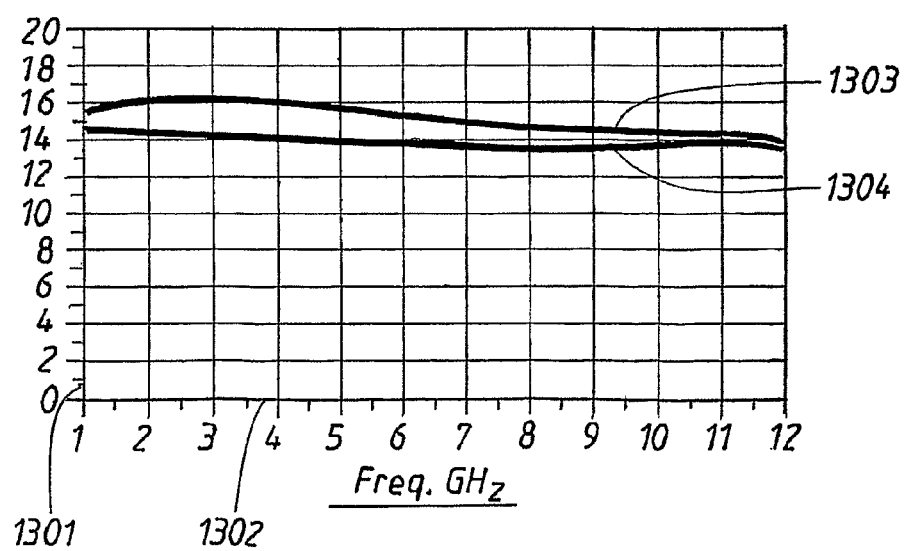
FIG. 13 illustrates an example of the difference in small signal amplification between a peak and non-peak network.

The active matching networks according to FIGS. 9a and 9b are examples on how to realize a so called peak network as it will produce a peak in the PAE and the output power and to a less extent in the small signal amplification within the bandwidth B. This is illustrated in FIGS. 10 and 13.

The active matching networks as described in FIGS. 3, 9a and 9b can in general terms be defined as comprising:
  at least one amplifier arranged to produce a boost to the output signal and
  a matching arrangement adapted to adjust output impedance of the distributed power amplifier over the bandwidth B.

FIG. 10 shows PAE in percentage on the y-axis 1001 as a function of frequency on the x-axis 1002. The percentage is calculated as $P_{out} - P_{in}$ divided with the total dc-power supplied to the complete distributed power amplifier. Graph 1003 shows the PAE value using an active matching non-peak network configuration according to FIG. 3 or FIG. 9b with the second matching transistor 902 turned on. As can be seen the PAE value is in this case fairly constant around 30% in the frequency band 1-12 GHz.

Graph 1004 shows the PAE value as a function of frequency when the second matching transistor 902, in the example of FIG. 9b, is turned off and the inductor 903 is shortening the second matching transistor 902. This represents a peak network. In this example an inductor with an inductance of 10 nH is used which results in a PAE peak around 3 GHz. This example of the invention also has the added advantage that the overall PAE performance is improved over the complete bandwidth B.

FIG. 11 illustrates with a graph 1103 the difference in PAE value between a peak and non-peak network in percentage on the y-axis 1101 as a function of frequency on the x-axis 1102. As can be seen in this example of the invention there is a positive difference over the complete frequency range 1-12 GHz.

Figure 12:
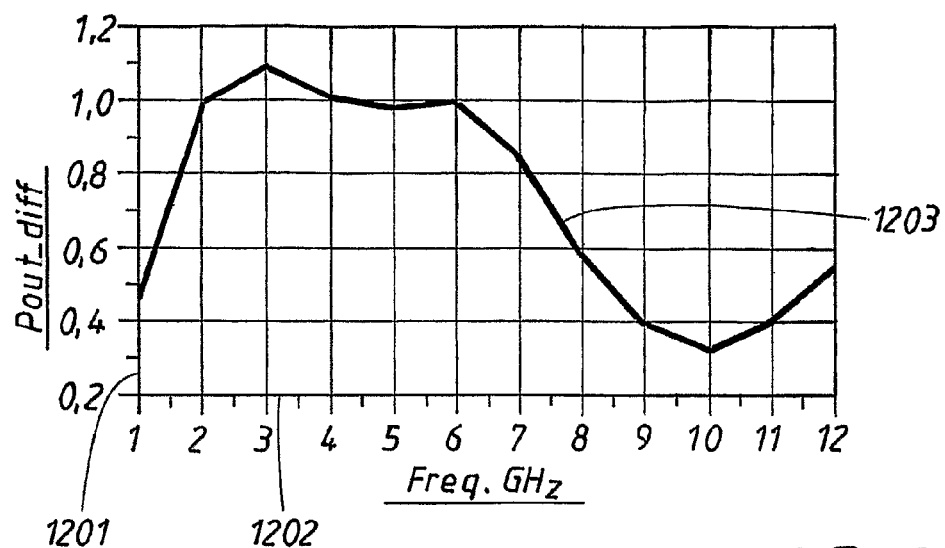
FIG. 12 illustrates an example of the improvement in output power expressed in dB between a peak and non-peak network.

FIG. 12 illustrates with a graph 1203 the difference in output power between a peak and non-peak network in dB on the y-axis 1201 as a function of frequency on the x-axis 1202. As can be seen in this example of the invention there is a positive difference over the complete frequency range 1-12 GHz.

FIG. 13 illustrates the difference in small signal amplification between a peak and non-peak network in dB on the y-axis 1301 as a function of frequency on the x-axis 1302. Graph 1303 shows the amplification with the peak network and graph 1304 with the non-peak network. As can be seen in this example of the invention there is a positive difference between the peak network and non-peak network over the complete frequency range 1-12 GHz.

The simulation results shown in FIGS. 5-8 and 10-13 are intended to illustrate examples of results achieved by implementing the invention.

The invention also includes a method to design a distributed power amplifier operating over a bandwidth B. The distributed power amplifier has an input side 201, with an input terminal IN for receiving an input signal and connected to an input transmission line 205, and an output side 202 with an output terminal OUT for delivering an output signal and connected to an output transmission line 209. The input signal is successively coupled from the input transmission line to the output transmission line through amplifiers connected between the input transmission line and the output transmission line. Both transmission lines have two ends wherein a power splitter 203 is connected to the input terminal IN, thus dividing the input signal in a first path to the input transmission line 205 and in a second path to an input 206 of an active matching circuit 207, 900a, 900b. The active matching circuit has an output 208 connected to the output transmission line 209, the other end of the output transmission line is connected to the output terminal OUT, thus achieving an improved PAE performance and increased power output over the bandwidth B.

The invention further includes a method to modify existing distributed power amplifiers operating over a bandwidth B and having an input side 201 with an input terminal IN, connected to an input transmission line 205, for receiving an input signal. The existing distributed power amplifiers also have an output side 202 with an output terminal OUT, connected to an output transmission line 209, for delivering an output signal. The input signal, such as an RF-signal, is successively coupled from the input transmission line to the output transmission line through amplifiers connected between the input transmission line and the output transmission line, both transmission lines having two ends. A power splitter 203 is inserted between the input terminal IN and the input transmission line, thus dividing the input signal in a first path to the input transmission line 205 and in a second path to an input 206 of an inserted active matching circuit 207, 900a, 900b, the inserted active matching circuit having an output 208 of the inserted active matching circuit connected to the output transmission line 209. The other end of the output transmission line is connected to the output terminal OUT, thus achieving an improved PAE performance and increased power output over the bandwidth B for the existing distributed power amplifier.

The invention is not limited to the embodiments and examples described above, but may vary freely within the scope of the amended claims.

The invention claimed is:

1. A distributed power amplifier arranged to operate over a bandwidth, the distributed power amplifier comprising:
    an input side comprising an input terminal arranged to receive an input signal and connected to an input transmission line,
    an output side comprising an output terminal adapted to deliver an output signal and connected to an output transmission line, the input signal being arranged to be successively coupled from the input transmission line to the output transmission line through amplifiers connected between the input transmission line and the output transmission line, both transmission lines having two ends,
    a power splitter connected to the input terminal, thus being arranged to divide the input signal in a first path to the input transmission line and in a second path to an input of an active matching circuit, the active matching circuit having an output connected to the output transmission line, the other end of the output transmission line being connected to the output terminal, thus achieving an improved power added efficiency performance and increased power output over the bandwidth,
    wherein
    the input transmission line comprises m transmission line sections $L_{in}$ connected in series, where n is an integer ranging from 1 to m,
    the output terminal, located at the output side of the distributed power amplifier, is connected to an output end of the output transmission line, the output transmission line comprising m transmission line sections $L_{on}$ connected in series, where n is an integer ranging from 1 to m,
    amplifiers $A_1$ to $A_{m-1}$ each with an input-terminal, an output-terminal and a ground-terminal, are connected to the input transmission line and the output transmission line, with the input terminal being connected to the input transmission line and the output terminal to the output transmission line, each ground terminal being connected to ground,
    there is one amplifier connection from a point between each pair of transmission line sections $L_{ip}/L_{ip+1}$ on the input transmission line to a point between each pair of transmission line sections $L_{op}/L_{op+1}$ on the output transmission line where p is an integer ranging from 1 to m−1,
    the output of the active matching circuit is connected to an opposite end of the output transmission line, and
    the active matching circuit comprises:
    at least one amplifier arranged to produce a boost to the output signal and
    a matching arrangement adapted to adjust output impedance of the distributed power amplifier over the bandwidth.

2. The distributed power amplifier according to claim 1, at the opposite input transmission line end a load is connected to ground.

3. The distributed power amplifier according to claim 1, wherein at the opposite output transmission line end, a first output load is connected to ground and at the output end, a second output load is connected to ground.

4. A distributed power amplifier arranged to operate over a bandwidth, the distributed power amplifier comprising:
- an input side comprising an input terminal arranged to receive an input signal and connected to an input transmission line,
- an output side comprising an output terminal adapted to deliver an output signal and connected to an output transmission line, the input signal being arranged to be successively coupled from the input transmission line to the output transmission line through amplifiers connected between the input transmission line and the output transmission line, both transmission lines having two ends,
- a power splitter connected to the input terminal, thus being arranged to divide the input signal in a first path to the input transmission line and in a second path to an input of an active matching circuit, the active matching circuit having an output connected to the output transmission line, the other end of the output transmission line being connected to the output terminal, thus achieving an improved power added efficiency performance and increased power output over the bandwidth wherein
- the active matching circuit is a non-peak network,
- the active matching circuit comprises a transistor having a gate terminal, a drain terminal and a source terminal,
- the second path of the input signal is connected to the input of the active matching circuit, the input of the active matching circuit is connected to the gate terminal of the transistor via an input load $Z_s$,
- the drain terminal is connected to the output of the active matching circuit via an output load $Z_L$,
- the output of the active matching circuit is connected to the opposite output transmission line end, and
- the source terminal of the transistor is connected to ground.

5. The distributed power amplifier according to claim 1, wherein the active matching circuit is a peak network.

6. A distributed power amplifier arranged to operate over a bandwidth, the distributed power amplifier comprising:
- an input side comprising an input terminal arranged to receive an input signal and connected to an input transmission line,
- an output side comprising an output terminal adapted to deliver an output signal and connected to an output transmission line, the input signal being arranged to be successively coupled from the input transmission line to the output transmission line through amplifiers connected between the input transmission line and the output transmission line, both transmission lines having two ends,
- a power splitter connected to the input terminal, thus being arranged to divide the input signal in a first path to the input transmission line and in a second path to an input of an active matching circuit, the active matching circuit having an output connected to the output transmission line, the other end of the output transmission line being connected to the output terminal, thus achieving an improved power added efficiency performance and increased power output over the bandwidth
- wherein the active matching circuit is a peak network, and
- wherein the active matching circuit comprises a first matching impedance $Z_1$, an amplifier arrangement $A_k$, a second matching impedance $Z_2$ and a circuit arrangement $A_p$ connected in series in the order mentioned, each component having two ends, the first matching impedance being further connected at a free end to the input of the active matching circuit and the circuit arrangement $A_p$ being further connected at a free end to the output of the active matching circuit.

7. The distributed power amplifier according to claim 6, wherein the active matching circuit comprises a first and a second matching transistor wherein:
- the active matching circuit has the input of the active matching circuit connected to the gate terminal of the first matching transistor, via a third matching impedance,
- the source terminal of the first matching transistor is connected to ground and the drain terminal is connected to the output of the active matching circuit via a fourth matching impedance,
- the output of the active matching circuit is connected to the opposite end of the output transmission line,
- the source terminal of the second matching transistor is connected to ground and the drain terminal of the second matching transistor is connected to the output of the active matching circuit via an impedance ($Z_R$),
- an inductor is applied between the source and the drain terminal of the second matching transistor, and
- the gate terminal of the second matching transistor is connected to ground via a DC biasing impedance in series with a control voltage source.

8. The distributed power amplifier according to claim 7, wherein the second matching transistor is arranged to be turned on and off by changing the voltage of the control voltage source.

9. The distributed power amplifier according to claim 7, wherein when the second matching transistor is arranged to be turned on, the output of the active matching circuit will be shorted to ground through the impedance $Z_R$ thus creating characteristics according to a non-peak network.

10. The distributed power amplifier according to claim 7, wherein the second matching transistor is arranged to be turned off, causing the output of the active matching circuit to be connected to ground via the impedance $Z_R$ and the inductor thus creating characteristics according to a peak network.

11. A distributed power amplifier arranged to operate over a bandwidth, the distributed power amplifier comprising:
- an input side comprising an input terminal arranged to receive an input signal and connected to an input transmission line,
- an output side comprising an output terminal adapted to deliver an output signal and connected to an output transmission line, the input signal being arranged to be successively coupled from the input transmission line to the output transmission line through amplifiers connected between the input transmission line and the output transmission line, both transmission lines having two ends,
- a power splitter connected to the input terminal, thus being arranged to divide the input signal in a first path to the input transmission line and in a second path to an input of an active matching circuit, the active matching circuit having an output connected to the output transmission line, the other end of the output transmission line being connected to the output terminal, thus achieving an improved power added efficiency performance and increased power output over the bandwidth,
- wherein the input transmission line starts at the input end with a fifth DC-blocking capacitor and ends with a sixth DC-blocking capacitor at an end opposite the input end, the opposite input transmission line end, and further wherein the output transmission line ends at the output end with a seventh DC-blocking capacitor and starts with an eighth DC-blocking capacitor at an end opposite the output end, the opposite output transmission line end.

12. A method to design a distributed power amplifier operating over a bandwidth and having an input side, with an input terminal for receiving an input signal and connected to an input transmission line, and an output side, with an output terminal for delivering an output signal and connected to an output transmission line, the input signal being successively coupled from the input transmission line to the output transmission line through amplifiers connected between the input transmission line and the output transmission line, both transmission lines having two ends, a power splitter is connected to the input terminal, thus dividing the input signal in a first path to the input transmission line and in a second path to an input of an active matching circuit, the active matching circuit having an output connected to the output transmission line, the other end of the output transmission line being connected to the output terminal, thus achieving an improved power added efficiency performance and increased power output over the bandwidth, wherein the input transmission line comprises m transmission line sections $L_{in}$ connected in series, where n is an integer ranging from 1 to m, the output terminal, located at the output side of the distributed power amplifier, is connected to an output end of the output transmission line, the output transmission line comprising m transmission line sections $L_{on}$ connected in series, where n is an integer ranging from 1 to m, amplifiers $A_1$ to $A_{m-1}$ each with an input-terminal, an output-terminal and a ground-terminal, are connected to the input transmission line and the output transmission line, with the input terminal being connected to the input transmission line and the output terminal to the output transmission line, each ground terminal being connected to ground, there is one amplifier connection from a point between each pair of transmission line sections $L_{ip}/L_{ip+1}$ on the input transmission line to a point between each pair of transmission line sections $L_{op}/L_{op+1}$ on the output transmission line where p is an integer ranging from 1 to m−1, the output of the active matching circuit is connected to an opposite end of the output transmission line, and the active matching circuit comprises:

at least one amplifier for producing a boost to the output signal and a matching arrangement for adjusting output impedance of the distributed power amplifier over the bandwidth.

13. A method to modify existing distributed power amplifiers operating over a bandwidth and having an input side with an input terminal, connected to an input transmission line, for receiving an input signal and an output side with an output terminal, connected to an output transmission line, for delivering an output signal, the input signal being successively coupled from the input transmission line to the output transmission line through amplifiers connected between the input transmission line and the output transmission line, both transmission lines having two ends, wherein a power splitter is inserted between the input terminal and the input transmission line, thus dividing the input signal in a first path to the input transmission line and in a second path to an input of an inserted active matching circuit, the inserted active matching circuit having an output of the inserted active matching circuit connected to the output transmission line, the other end of the output transmission line being connected to the output terminal, thus achieving an improved power added efficiency performance and increased power output over the bandwidth for the existing distributed power amplifier, wherein the input transmission line comprises m transmission line sections $L_{in}$ connected in series, where n is an integer ranging from 1 to m, the output terminal, located at the output side of the distributed power amplifier, is connected to an output end of the output transmission line, the output transmission line comprising m transmission line sections $L_{on}$ connected in series, where n is an integer ranging from 1 to m, amplifiers $A_1$ to $A_{m-1}$ each with an input-terminal, an output-terminal and a ground-terminal, are connected to the input transmission line and the output transmission line, with the input terminal being connected to the input transmission line and the output terminal to the output transmission line, each ground terminal being connected to ground, there is one amplifier connection from a point between each pair of transmission line sections $L_{ip}/L_{ip+1}$ on the input transmission line to a point between each pair of transmission line sections $L_{op}/L_{op+1}$ on the output transmission line where p is an integer ranging from 1 to m−1, the output of the active matching circuit is connected to an opposite end of the output transmission line, and the active matching circuit comprises:

at least one amplifier for producing a boost to the output signal and a matching arrangement for adjusting output impedance of the distributed power amplifier over the bandwidth.

* * * * *